United States Patent
Heo et al.

(10) Patent No.: US 9,105,556 B2
(45) Date of Patent: Aug. 11, 2015

(54) TUNNELING FIELD-EFFECT TRANSISTOR INCLUDING GRAPHENE CHANNEL

(71) Applicant: Samsung Electronics Co., Ltd., Suwon-Si, Gyeonggi-Do (KR)

(72) Inventors: Jin-seong Heo, Seoul (KR); Seong-jun Park, Seoul (KR); Kyung-eun Byun, Uijeongbu-si (KR); David Seo, Yongin-si (KR); Hyun-jae Song, Hwaseong-si (KR); Jae-ho Lee, Seoul (KR); Hyun-jong Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/906,657

(22) Filed: May 31, 2013

(65) Prior Publication Data

US 2014/0097403 A1    Apr. 10, 2014

(30) Foreign Application Priority Data

Oct. 9, 2012    (KR) .................. 10-2012-0112087

(51) Int. Cl.
*H01L 29/06*    (2006.01)
*H01L 29/66*    (2006.01)
(Continued)

(52) U.S. Cl.
CPC ............ *H01L 29/16* (2013.01); *H01L 29/0895* (2013.01); *H01L 29/1606* (2013.01);
(Continued)

(58) Field of Classification Search
CPC ............ H01L 29/778; H01L 29/78684; H01L 29/0895; H01L 29/1606; H01L 29/66977; H01L 29/772; H01L 29/66015; H01L 29/13088; H01L 29/66045; H01L 29/41733; H01L 29/7311; H01L 29/7391; H01L 29/78696

USPC .......... 257/9, 105, E29.262, E29.168, 29, 30, 257/38, 39, 20, 414, 330–337, E29.005, 257/E29.082, E29.297, E29.245, E21.209, 257/E21.422, E29.304, E29.306, E21.41, 257/E29.555; 977/938, 842.734; 438/268, 438/286, 158, 187, 201, 211, 257, 591, 270

See application file for complete search history.

(56) References Cited

U.S. PATENT DOCUMENTS 8,053,782 B2    11/2011    Avouris et al.
2010/0085713 A1    4/2010    Balandin et al.
(Continued)

FOREIGN PATENT DOCUMENTS

KR    2010-0074442 A    7/2010
KR    2010-0114205 A    10/2010
(Continued)

OTHER PUBLICATIONS

L. Britnell et al.: "Field-Effect Tunneling Transistor Based on Vertical Graphene Heterostructures"; Science vol. 335, pp. 947-950; 2012.

(Continued)

*Primary Examiner* — Chuong A Luu
*Assistant Examiner* — Moazzam Hossain
(74) *Attorney, Agent, or Firm* — Harness, Dickey & Pierce, P.L.C.

(57) ABSTRACT

According to example embodiments, a tunneling field-effect transistor (TFET) includes a first electrode on a substrate, a semiconductor layer on a portion of the first electrode, a graphene channel on the semiconductor layer, a second electrode on the graphene channel, a gate insulating layer on the graphene channel, and a gate electrode on the gate insulating layer. The first electrode may include a portion that is adjacent to the first area of the substrate. The semiconductor layer may be between the graphene channel and the portion of the first electrode. The graphene channel may extend beyond an edge of at least one of the semiconductor layer and the portion of the first electrode to over the first area of the substrate.

22 Claims, 3 Drawing Sheets

(51) Int. Cl.
  *H01L 21/336* (2006.01)
  *H01L 29/16* (2006.01)
  *H01L 29/786* (2006.01)
  *H01L 29/08* (2006.01)
  *H01L 29/78* (2006.01)
  *H01L 29/739* (2006.01)
  *B82Y 99/00* (2011.01)

(52) U.S. Cl.
  CPC ............ *H01L29/7391* (2013.01); *H01L 29/78* (2013.01); *H01L 29/7869* (2013.01); *H01L 29/78681* (2013.01); *H01L 29/78684* (2013.01); *H01L 29/78696* (2013.01); *B82Y 99/00* (2013.01)

(56) References Cited

U.S. PATENT DOCUMENTS

| | | | |
|---|---|---|---|
| 2010/0258787 A1* | 10/2010 | Chae et al. | 257/39 |
| 2011/0220865 A1 | 9/2011 | Miyata et al. | |
| 2011/0278670 A1* | 11/2011 | Loh et al. | 257/336 |
| 2011/0303950 A1* | 12/2011 | Lauer et al. | 257/192 |
| 2012/0001761 A1 | 1/2012 | Voutilainen et al. | |
| 2012/0032227 A1* | 2/2012 | Seabaugh et al. | 257/105 |
| 2012/0049160 A1* | 3/2012 | Sano et al. | 257/27 |
| 2012/0098028 A1 | 4/2012 | Naito | |
| 2012/0161106 A1 | 6/2012 | Kim et al. | |
| 2012/0181509 A1* | 7/2012 | Liang et al. | 257/29 |
| 2012/0305891 A1* | 12/2012 | Nayfeh et al. | 257/26 |
| 2012/0328906 A1 | 12/2012 | Kwon et al. | |
| 2013/0048951 A1 | 2/2013 | Heo et al. | |
| 2013/0214252 A1* | 8/2013 | Park et al. | 257/29 |

FOREIGN PATENT DOCUMENTS

| | | |
|---|---|---|
| KR | 20110020443 A | 3/2011 |
| KR | 2011-0102132 A | 9/2011 |
| KR | 2012-0042673 A | 5/2012 |
| WO | WO-2012-051202 A1 | 4/2012 |

OTHER PUBLICATIONS

European Search Report dated Dec. 18, 2013.

* cited by examiner

TUNNELING FIELD-EFFECT TRANSISTOR INCLUDING GRAPHENE CHANNEL

CROSS-REFERENCE TO RELATED APPLICATION

This application claims priority under 35 U.S.C. §119 to Korean Patent Application No. 10-2012-0112087, filed on Oct. 9, 2012 in the Korean Intellectual Property Office, the disclosure of which is incorporated herein in its entirety by reference.

BACKGROUND

1. Field

Example embodiments relate to tunneling field-effect transistors (TFETs) including graphene channels, and more particularly, to TFETs in which a gate voltage is applied to tunnel carriers through a semiconductor between a graphene channel and an electrode.

2. Description of the Related Art

Graphene having a two-dimensional hexagonal carbon structure may replace semiconductors in some electronic devices. Recently, worldwide studies about graphene have been conducted. When graphene having a zero gap semiconductor is manufactured as a graphene nano-ribbon (GNR) that has a width of less than or equal to 10 nm, a band gap is formed in the GNR due to size effect, and thus, a field-effect transistor (FET) operating at room temperature may be prepared using the GNR.

When a graphene transistor using a GNR is prepared, an on/off ratio of the graphene transistor may increase, but a mobility in the GNR may decrease due to a disordered edge of the GNR. As a result, an on-current of the graphene transistor may be low. Alternatively, a vertical electric field may be applied to a bilayered graphene to form the band gap. However, it may be difficult to grow a uniform bilayered graphene using large-area chemical vapor deposition (CVD).

SUMMARY

Example embodiments relate to tunneling field-effect transistors (TFETs) including graphene channels that provide devices that control current tunneling through a semiconductor between a graphene channel and an electrode by applying a gate voltage.

Additional aspects will be set forth in part in the description which follows and, in part, will be apparent from the description, or may be learned by practice of example embodiments.

According to example embodiments, a tunneling field-effect transistor (TFET) includes: a substrate; a first electrode on the substrate, the first electrode including a portion that is adjacent to a first area of the substrate; a semiconductor layer on the portion of the first electrode; a graphene channel on the semiconductor layer; a second electrode on the graphene channel; a gate insulating layer on the graphene channel, and a gate electrode on the gate insulating layer. The semiconductor layer is between the graphene channel and the portion of the first electrode. The graphene channel extends beyond an edge of at least one of the semiconductor layer and the portion of the first electrode.

In example embodiments, a first insulating layer may be between the graphene channel and the first area of the substrate.

In example embodiments, the first electrode may include a body portion and an extension portion, the extension portion may extend from the body portion toward the first area, and the portion of the first electrode may be the extension portion.

In example embodiments, a thickness of the extension portion may be less than a thickness of the body portion.

In example embodiments, the semiconductor layer may include at least one of galium indium zinc oxide (GIZO), a-Si, Si, HIZO, $MoS_2$, CdSe, ZnO, AlP, InP, $SrTiO_3$, Ge, GaAs, SiC, AlAs, GaN, CdTe, CuO, NiO, and GaMnAs.

In example embodiments, a thickness of the semiconductor layer may be about 1 nm to about 30 nm.

In example embodiments, the first electrode may include at least one of Pt, Ni, Au, Pd, Co, Be, Cu, Re, Ru, Fe, W, Sb, Mo, Ag, and Cr.

In example embodiments, the semiconductor layer may include impurities, and the transistor described above may be a unipolar transistor having a same polarity as a polarity of the impurities in the semiconductor layer.

In example embodiments, the gate electrode, depending on a gate voltage that is applied to the gate electrode, may be configured to change a tunneling thickness of an energy band of the semiconductor layer between the first electrode and the graphene channel.

In example embodiments, a thickness of the graphene channel may be 1 to 4 layers of graphene.

In example embodiments, a first energy barrier may be formed at one of: an interface between the semiconductor layer and the first electrode, and an interface between the semiconductor layer and the graphene channel.

In example embodiments, a second energy barrier may be formed at other of: the interface between the semiconductor layer and the first electrode, and the interface between the semiconductor layer and the graphene. A level of the second energy barrier may be lower than a level of the first energy barrier.

In example embodiments, the second energy barrier may be less than or equal to 0.3 eV.

According to example embodiments, a tunneling field-effect transistor (TFET) includes: a first electrode; a semiconductor layer on the first electrode; a graphene channel on the semiconductor layer, the graphene channel including a portion that extends away from at least one of the semiconductor layer and the first electrode; a second electrode on the portion of the graphene channel, the second electrode being spaced apart from the semiconductor layer and the first electrode; a gate electrode on the graphene channel; a gate insulating layer between the gate electrode and at least one of the first electrode, the graphene channel, and the second electrode.

In example embodiments, the portion of the graphene channel may be on a first insulating layer.

In example embodiments, the gate electrode, depending on a gate voltage that is applied to the gate electrode, may be configured to change a tunneling thickness of an energy band of the semiconductor layer between the first electrode and the graphene channel.

In example embodiments, a first energy barrier may be formed at one of: an interface between the semiconductor layer and the first electrode, and an interface between the semiconductor layer and the graphene channel. A second energy barrier may be formed at other of: the interface between the semiconductor layer and the first electrode, and the interface between the semiconductor layer and the graphene. A level of the second energy barrier may be different than a level of the first energy barrier.

In example embodiments, the first electrode may include a body portion and an extension portion, the semiconductor layer may be on the extension portion, and a thickness of the extension portion may be less than a thickness of the body portion.

In example embodiments, the semiconductor layer may include impurities, and the TFET may be a unipolar transistor having a same polarity as a polarity of the impurities in the semiconductor layer.

In example embodiments, a thickness of the graphene channel may be 1 to 4 layers of graphene, and the semiconductor layer may include at least one of galium indium zinc oxide (GIZO), a-Si, Si, HIZO, $MoS_2$, CdSe, ZnO, AlP, InP, $SrTiO_3$, Ge, GaAs, SiC, AlAs, GaN, CdTe, CuO, NiO, and GaMnAs.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
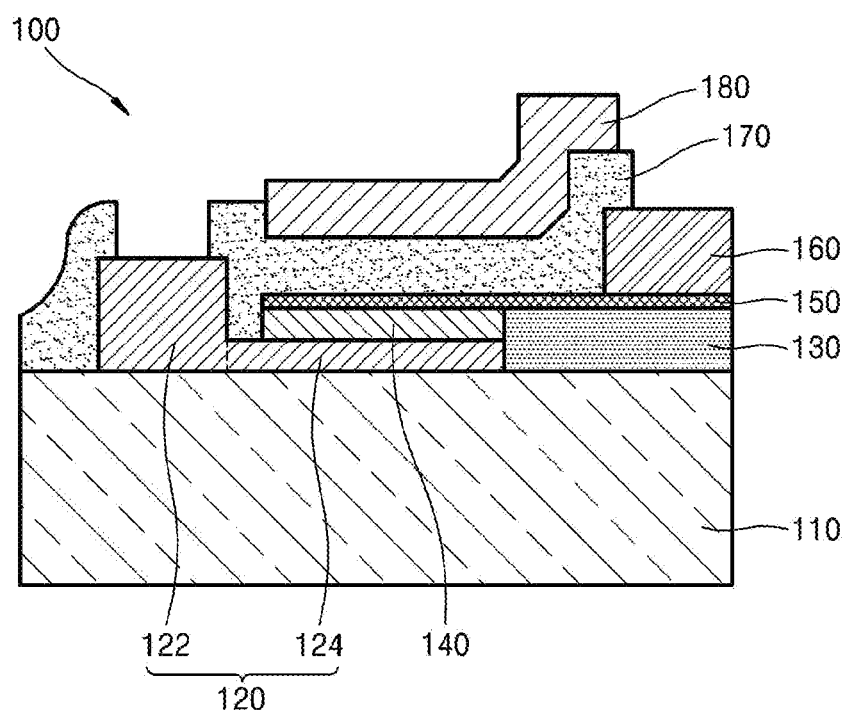
FIG. 1 is a cross-sectional view illustrating a tunneling field-effect transistor (TFET) including a graphene channel according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a tunneling field-effect transistor (TFET) 100 including a graphene channel according to example embodiments.

Referring to FIG. 1, a TFET according to example embodiments includes a first electrode 120 on a substrate 110, and a first insulating layer 130 is formed in an area adjacent to the first electrode 120. The first electrode 120 may include a body portion 122 and an extension portion 124 that extends to the first insulating layer 130. One end of the extension portion 124 may be disposed adjacent to the first insulating layer 130. The extension portion 124 may be thinner than the body portion 122.

A semiconductor layer 140 is formed on the extension portion 124, and a graphene channel 150 is formed on the semiconductor layer 140. The graphene channel 150 may extend onto the first insulating layer 130. On the graphene channel 150, a second electrode 160 formed to face the first insulating layer 130.

A gate insulating layer 170, which covers a portion of the first electrode 120 and a portion of the graphene channel 150 and a portion of the second electrode 160, is formed on the substrate 110. A gate electrode 180 is formed on the gate insulating layer 170. The gate electrode 180 is formed to correspond to the graphene channel 150.

The first insulating layer 130 may be formed of a dielectric material such as silicon oxide or a silicon nitride.

The substrate 110 may be formed of glass, plastic, semiconductor, or the like.

The semiconductor layer 140 may be formed of galium indium zinc oxide (GIZO), amorphous Si, Si, hafnium-indium-zinc oxide (HIZO), $MoS_2$, CdSe, ZnO, AlP, InP, $SrTiO_3$, Ge, GaAs, SiC, AlAs, GaN, CdTe, CuO, NiO, GaMnAs, or the like. The semiconductor layer 140 forms a first energy barrier at one interface with the first electrode 120 or the graphene channel 150 and forms no energy barrier or a second energy barrier which is lower than the first energy barrier at another interface with the graphene channel 150 or the first electrode 120. The second energy barrier may be less than or equal to 0.3 eV.

The semiconductor layer 140 may be formed to a thickness that carriers may tunnel through, for example a thickness in a range of about 1 nm to about 30 nm.

The semiconductor layer 140 may be doped with n-type impurities or p-type impurities. As shown in FIG. 1, the semiconductor layer 140 may disposed to face the gate electrode 180 with the graphene channel 150 in between. Accordingly, an energy band of the semiconductor layer 140 may be affected by a gate voltage.

The first electrode 120 may be formed of a material that forms an energy barrier with the semiconductor layer 140. The first electrode 120 may be formed of platinum (Pt), nickel (Ni), gold (Au), palladium (Pd), cobalt (Co), beryllium (Be), rhenium (Re), ruthenium (Ru), iron (Fe), tungsten (W), antimony (Sb), molybdenum (Mo), silver (Ag), chromium (Cr), or the like.

The graphene channel 150 may be formed using a graphene fabricated by chemical vapor deposition (CVD). The graphene channel 150 may be composed of from 1 to 4 layers of graphene. The graphene channel 150 may include a thickness of 1 to 4 atomic layers of graphene. The graphene channel 150 may be a pathway that carriers move through, and a band gap of the graphene channel 150 may be zero or less than or equal to 30 meV.

The second electrode 160 may be formed of general metal or poly-silicon, or the like. The second electrode 160 may be formed of a same metal as the first electrode 120.

The gate insulating layer 170 may be formed of a dielectric material such as silicon oxide or a silicon nitride.

A gate electrode 180 may be formed of general metal or poly-silicon. In addition, the gate electrode 180 may be formed of transparent conductive materials, for example, transparent conductive oxides such as Indium Tin Oxide (ITO).

The vertical structure wherein the semiconductor layer 140 and the graphene channel 150 are sequentially formed on the extension portion 124 of the first electrode 120 has an increasing pathway for the carriers to move along due to an increasing area in which migration of the carriers occurs. Accordingly, the mobility of the carriers may be improved as well as the amount of the movement of the carriers.

The first insulating layer 130 may be designed to reduce (and/or prevent) the flow of the carriers from the second electrode 160 to the substrate 110, and the first insulating layer 130 may be omitted from the configuration when the substrate 110 is formed of insulating materials.

The TFET 100 including the graphene channel 150 may be a unipolar transistor which is either an n-type or a p-type transistor depending on the polarities of the semiconductor layer 140. That is, when the semiconductor layer 140 is doped with n-type impurities, the TFET 100 becomes an n-type transistor, and when the semiconductor layer 140 is doped with p-type impurities, the TFET 100 becomes a p-type transistor.

Figure 2A:
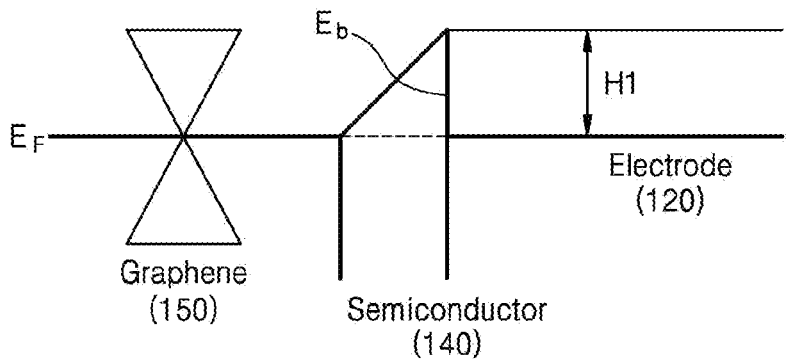
FIGS. 2A through 2C are energy band diagrams describing an operation of the TFET of FIG. 1.
Figure 2B:
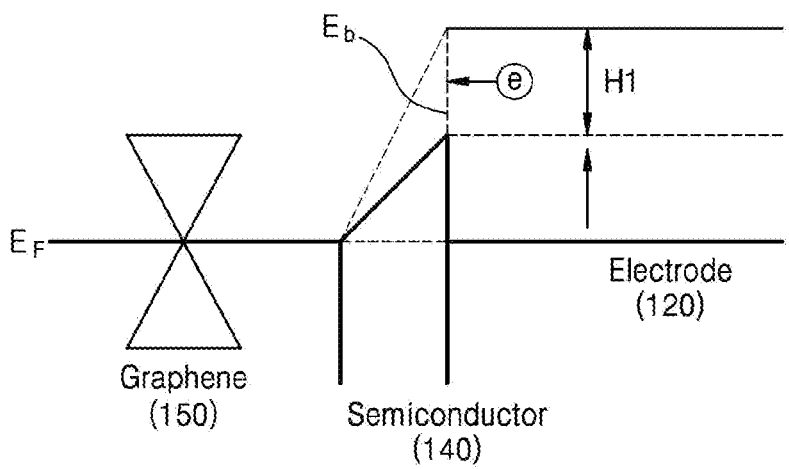
Figure 2C:
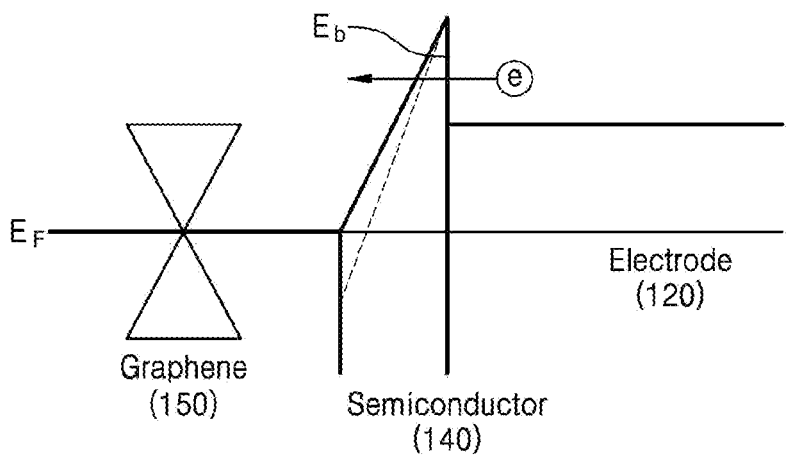

FIGS. 2A through 2C are energy band diagrams describing an operation of the TFET 100 according to example embodiments. Herein, the first electrode 120 was formed of Pt the semiconductor layer 140 was formed of GIZO, and the semiconductor layer 140 was doped with n-type impurities; therefore, the field-effect transistor is an n-type transistor. As the n-type impurities, hydrogen (H) was used but a void may be used to replace hydrogen. A thickness of the GIZO was about 20 nm, and the atomic ratio of Ga:In:Zn was 0.391:0.176:0.433.

FIG. 2A is an energy band diagram before a voltage and a gate voltage has yet been applied. On opposite sides of the semiconductor layer 140, energy band structures of the graphene channel 150 and the first electrode 120 are disposed to correspond to work functions thereof, respectively. Hereinafter, the n-type TFET 100 including the semiconductor layer 140 that was doped with n-type impurities will be described. Main carriers of the field-effect transistor are electrons.

There was no energy barrier between the graphene channel 150 and the semiconductor layer 140. Instead, an energy barrier ($E_b$) having a height (H1) of 1.0 eV was formed between the graphene channel 150 and the first electrode 120. The first electrode 120 may function as a source electrode. The $E_F$ shown in the figures refers to a Fermi energy level of the graphene channel 150.

FIG. 2B is an energy band diagram when a negative voltage was applied to the first electrode 120. As the negative voltage was applied to the first electrode 120, the Fermi level of the first electrode 120 was relatively increased as illustrated by a dotted line. Although the height (H1) of the energy barrier ($E_b$) was unchanged, the tunneling thickness of the energy band of the semiconductor layer 140 was reduced. Herein, the electrons do not tunnel through the energy band of the semiconductor layer 140 from the first electrode 120.

FIG. 2C is an energy band diagram when a positive gate voltage was applied to the gate electrode 180. Due to the application of the positive gate voltage, the Fermi level of the graphene channel 150 was increased. As illustrated by a dotted line in FIG. 2C, the energy level of the semiconductor layer 140 was relatively lowered compared to that of the graphene channel 150. Therefore, the tunneling thickness of the energy band of the semiconductor layer 140 was reduced, and accordingly the electrons were moved to the graphene channel 150 by tunneling through the semiconductor layer 140 from the first electrode 120.

As the positive voltage was increasingly applied to the gate electrode 180, the electrons were easily moved, and thus, current in the TFET 100 was also increased.

Figure 3:
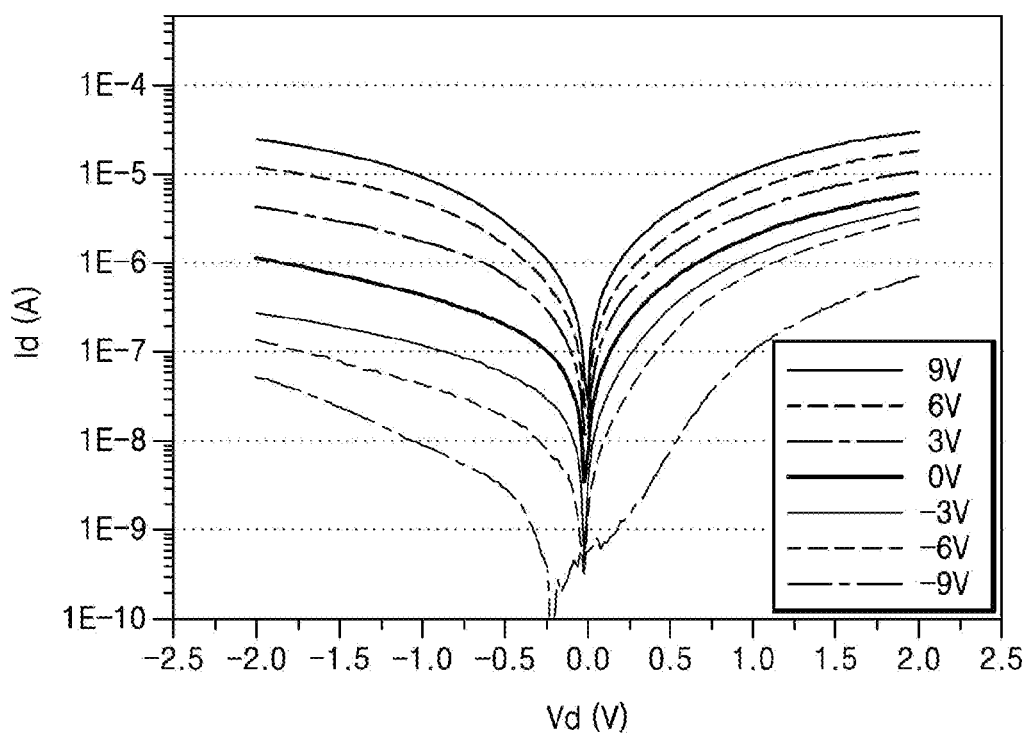
FIG. 3 is a graph illustrating I-V characteristics of a TFET including a graphene channel according to example embodiments.

FIG. 3 is a graph illustrating I-V characteristics of a TFET including a graphene channel according to example embodiments. The first electrode was formed of Pt and the semiconductor layer was formed of GIZO. The semiconductor layer was doped with n-type impurities; therefore, the field-effect transistor was an n-type transistor.

Referring to the FIG. 3, a gate voltage in a range of from −9V to 9V was applied to the transistor. As illustrated in FIG. 3, the drain current (Id) increases as the gate voltage is increased. Also, as illustrated in FIG. 3, the drain current (Id) may increase based on a magnitude of Vd(V), a voltage applied to the first electrode 120.

The operation of the n-type TFET 100 has been described above, but in a p-type TFET, the carriers may be holes and a negative gate voltage may be applied to turn on the transistor. A detailed description thereof will be omitted here.

In addition, when the energy barrier at the interface between the graphene channel and the semiconductor layer is greater than that at the interface between the semiconductor layer and the first electrode, a source-drain voltage is reversely applied and the carriers are moved from the second electrode to the first electrode. A detailed description thereof will be omitted here.

As described above, in example embodiments, a TFET including a graphene channel may lower a sub-threshold swing to less than 60 mV/dec, and accordingly have a low driving voltage, and thus, may improve a driving speed by using high mobility of the graphene.

It should be understood that example embodiments described herein should be considered in a descriptive sense only and not for purposes of limitation. Descriptions of features or aspects within each TFET according to example embodiments should typically be considered as available for other similar features or aspects in other TFETs according to example embodiments.

While some example embodiments have been particularly shown and described, it will be understood by one of ordinary skill in the art that variations in form and detail may be made therein without departing from the spirit and scope of the claims.

What is claimed is:

1. A tunneling field-effect transistor (TFET) comprising:
a substrate;
a first electrode on the substrate, the first electrode being a metal, the first electrode including a portion that is adjacent to a first area of the substrate;
a semiconductor layer directly on top of the portion of the first electrode;
a graphene channel on the semiconductor layer,
the semiconductor layer being between the graphene channel and the portion of the first electrode,
the graphene channel extending beyond an edge of at least one of the semiconductor layer and the portion of the first electrode to over the first area of the substrate;
a second electrode on the graphene channel,
the second electrode being over the first area of the substrate;
a gate insulating layer on the graphene channel; and
a gate electrode on the gate insulating layer.

2. The TFET of the claim 1, further comprising:
a first insulating layer between the graphene channel and the first area of the substrate.

3. The TFET of claim 1, wherein
the first electrode comprises a body portion and an extension portion,
the extension portion extends from the body portion toward the first area, and
the portion of the first electrode is the extension portion.

4. The TFET of claim 3, wherein a thickness of the extension portion is less than a thickness of the body portion.

5. A tunneling field-effect transistor (TFET) comprising:
a substrate;
a first electrode on the substrate, the first electrode including a portion that is adjacent to a first area of the substrate;
a semiconductor layer on the portion of the first electrode, the semiconductor layer including at least one of gallium indium zinc oxide (GIZO), a-Si, Si, HIZO, $MoS_2$, CdSe, ZnO, AlP, InP, $SrTiO_3$, Ge, GaAs, SiC, AlAs, GaN, CdTe, CuO, NiO, and GaMnAs;
a graphene channel on the semiconductor layer, the semiconductor layer being between the graphene channel and the portion of the first electrode, the graphene channel extending beyond an edge of at least one of the semiconductor layer and the portion of the first electrode to over the first area of the substrate;
a second electrode on the graphene channel, the second electrode being over the first area of the substrate;
a gate insulating layer on the graphene channel; and
a gate electrode on the gate insulating layer.

6. The TFET of claim 1, wherein a thickness of the semiconductor layer is about 1 nm to about 30 nm.

7. The TFET of claim 1, wherein the first electrode includes at least one of Pt, Ni, Au, Pd, Co, Be, Cu, Re, Ru, Fe, W, Sb, Mo, Ag, and Cr.

8. The TFET of claim 1, wherein
the semiconductor layer includes impurities, and
the TFET is a unipolar transistor having a same polarity as a polarity of the impurities in the semiconductor layer.

9. The TFET of claim 1, wherein the gate electrode, depending on a gate voltage that is applied to the gate electrode, is configured to change a tunneling thickness of an energy band of the semiconductor layer between the first electrode and the graphene channel.

10. The TFET of claim 1, a thickness of the graphene channel is 1 to 4 layers of graphene.

11. The TFET of claim 1, wherein a first energy barrier is formed at one of:
an interface between the semiconductor layer and the first electrode; and
an interface between the semiconductor layer and the graphene channel.

12. The TFET of claim 11, wherein
a second energy barrier is formed at an other of:
the interface between the semiconductor layer and the first electrode, and
the interface between the semiconductor layer and the graphene channel; and
a level the second energy barrier is lower than a level of the first energy barrier.

13. The TFET of claim 12, wherein the second energy barrier is less than or equal to 0.3 eV.

14. A tunneling field-effect transistor (TFET) comprising:
a first electrode, the first electrode being a metal;
a semiconductor layer directly on top of the first electrode;
a graphene channel on the semiconductor layer,
the graphene channel including a portion that extends away from at least one of the semiconductor layer and the first electrode;
a second electrode on the portion of the graphene channel, the second electrode being spaced apart from the semiconductor layer and the first electrode;
a gate electrode on the graphene channel;
a gate insulating layer between the gate electrode and at least one of the first electrode, the graphene channel, and the second electrode.

15. The TFET of claim 14, further comprising:
a first insulating layer,
wherein the portion of the graphene channel is on the first insulating layer.

16. The TFET of claim 14, wherein the gate electrode, depending on a gate voltage that is applied to the gate electrode, is configured to change a tunneling thickness of an energy band of the semiconductor layer between the first electrode and the graphene channel.

17. The TFET of claim 14, wherein
a first energy barrier is formed at an interface between the semiconductor layer and the first electrode,
second energy barrier is formed at an interface between the semiconductor layer and the graphene channel, and
a level of the first energy barrier is different than a level of the second energy barrier.

18. The TFET of claim 14, wherein
the first electrode comprises a body portion and an extension portion,
the semiconductor layer is on the extension portion, and
a thickness of the extension portion is less than a thickness of the body portion.

19. The TFET of claim 14, wherein
the semiconductor layer includes impurities, and
the TFET is a unipolar transistor having a same polarity as a polarity of the impurities in the semiconductor layer.

20. The TFET of claim 14, wherein
a thickness of the graphene channel is 1 to 4 layers of graphene; and
the semiconductor layer includes at least one of gallium indium zinc oxide (GIZO), a-Si, Si, HIZO, $MoS_2$, CdSe, ZnO, AlP, InP, $SrTiO_3$, Ge, GaAs, SiC, AlAs, GaN, CdTe, CuO, NiO, and GaMnAs.

21. The TFET of claim 1, wherein
the first electrode is directly on the substrate,
the graphene channel is not in direct contact with the first electrode,
the second electrode is spaced apart from semiconductor layer and the first electrode,
the gate insulating layer covers a portion of the graphene channel, the portion of the first electrode, and a portion of the second electrode, and
the gate insulating layer isolates the first and second electrode.

22. The TFET of claim 14, wherein
the graphene channel is not in direct contact with the first electrode, and
the gate insulating layer is between the gate electrode and the portion of the graphene channel, a portion of the first electrode, and a portion of the second electrode.

* * * * *